United States Patent [19]

Ramet

[11] 4,036,171
[45] July 19, 1977

[54] VACUUM DEPOSITION THROUGH PLURAL MASKS ON PLURAL SUBSTRATES

[75] Inventor: Gilbert Ramet, Cheseaux-Noreaz, Switzerland

[73] Assignee: Ebauches S.A., Neuchatel, Switzerland

[21] Appl. No.: 554,458

[22] Filed: Mar. 3, 1975

[30] Foreign Application Priority Data

Mar. 4, 1974 Switzerland .................. 3000/74

[51] Int. Cl.² ............................................. C23C 13/12
[52] U.S. Cl. .................................. 118/49.1; 427/259; 427/294
[58] Field of Search ................... 118/48–49.5; 427/259, 294, 402

[56] References Cited

U.S. PATENT DOCUMENTS

| | | | |
|---|---|---|---|
| 2,767,682 | 10/1956 | Smith | 118/49 |
| 2,975,753 | 3/1961 | Hayes | 118/49 |
| 3,023,727 | 3/1962 | Theodoseau et al. | 118/49 X |
| 3,117,025 | 1/1964 | Learn et al. | 118/49 |
| 3,238,918 | 3/1966 | Radke et al. | 118/49.1 |
| 3,336,898 | 8/1967 | Simmons et al. | 118/49 |
| 3,352,282 | 11/1967 | Schweitzer | 118/49 |
| 3,598,083 | 8/1971 | Dort et al. | 118/48 |
| 3,853,091 | 12/1974 | Christensen et al. | 118/49 |

*Primary Examiner*—Mervin Stein
*Attorney, Agent, or Firm*—Young & Thompson

[57] ABSTRACT

Apparatus for the vacuum deposition of a plurality of successive layers on each of a plurality of substrates, comprises a vacuum chamber having selectively shieldable cups for heating and evaporating the material to be deposited, and a pair of relatively rotatable plates suspended in the vacuum chamber, the one plate to carry at least one circular series of substrates, and the other plate to carry at least one circular series of masks selectively and sequentially registrable with the substrates and through which the successive layers are applied. Means are provided for moving the plates toward and away from each other, for rotating them continuously conjointly, and for rotating them selectively relatively stepwise.

6 Claims, 8 Drawing Figures

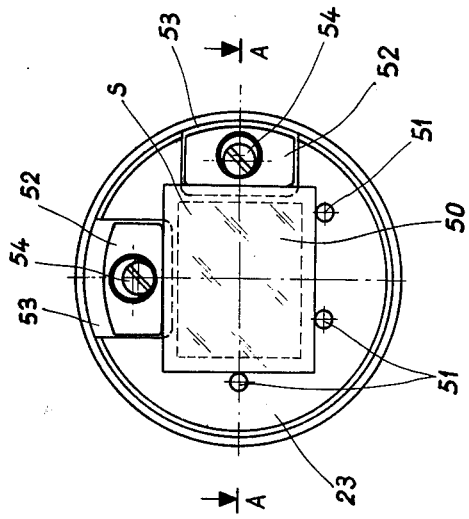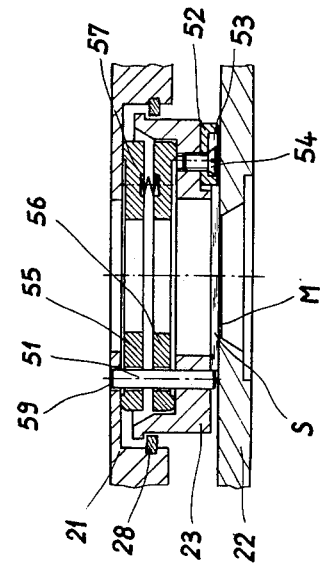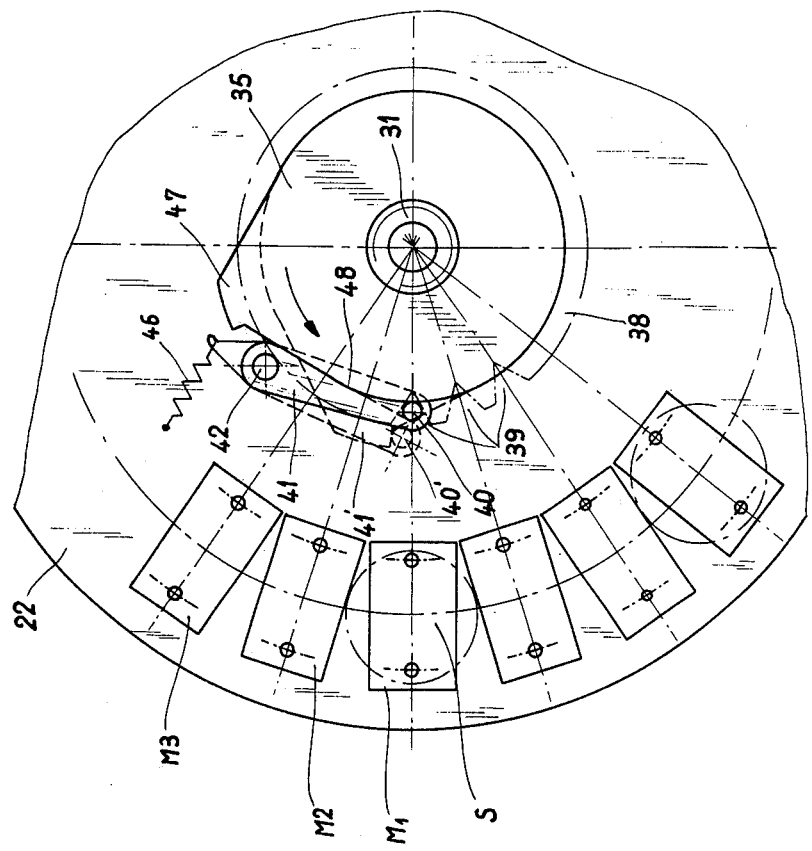

VACUUM DEPOSITION THROUGH PLURAL MASKS ON PLURAL SUBSTRATES

The present invention relates to apparatus for vacuum deposition and more particularly for the vacuum deposition of plural layers on substrates through masks, a plurality of each of the layers being deposited simultaneously on a plurality of substrates through corresponding plural masks.

The present invention also relates to apparatus comprising a vacuum chamber, at least one support for substrates, at least one support for masks, and means to vacuum deposit a plurality of layers of material on a substrate through the masks from evaporation cups.

Apparatus is already known for the vacuum deposition of successive plural layers of material on identical substrates through different masks. In general such apparatus comprises, in addition to substrates and masks to be applied against the surface of the substrates during the evaporation operation, obturators which are manipulated to cover at least a part of the substrates during the different phases of operation. These known devices ordinarily provide for intermittent advance of the substrates, this advance being halted at evaporation stations each of which is provided with an evaporation cup.

Such devices comprise a complicated mechanism; and by virtue of the fact that each substrate is treated in different evaporation stations, it is impossible to achieve a regular and homogeneous deposit of the layers on the assembly of the substrates.

The apparatus is characterized in that the support for the substrates comprises a horizontal rotatable plate, that for the masks comprising a rotatable plate disposed in a plane parallel to the plane of the first plate, the means for depositing the layers comprising at least one cup containing material to be deposited on the substrates, a mask change mechanism that moves the plates toward and away from each other and that advances one plate with respect to the other, an alignment system for the masks relative to the substrates, and a drive means for uniformly rotating the mask-substrate assembly.

According to another preferred form of the invention, a certain number of substrates are disposed on the same circular plate, aligned in one or more concentric circles and spaced apart from each other. On the mask support, which is constituted by a second circular plate parallel to the first, the masks are grouped in series, each series comprising the same sequence of masks, and each mask of a given series being different from the others of the same series. At the outset, the first mask of each series, and thus the mask through which will be deposited the first layer, is registered with a substrate and then the other masks of the same series are disposed facing the space between adjacent substrates. After the deposit of the first layer, the second mask of each series is brought into registry with a substrate by rotation of the mask support relative to the substrate support.

In general, if $n$ is the number of substrates of a given circle on the circular plate, and $p$ is the number of different masks of a given series, the angle through which it is necessary to turn the mask support to bring the $k$th mask into registry with the substrates, the $k - 1$ layer being deposited on the substrate, is equal to $2\pi/np$. Thus the $n$ first identical masks are brought initially into registry with each substrate, the $n(p - 1)$ other masks being located confronting the $n$ intervals between two successive substrates. For example, if the number of masks is equal to 3, and the substrates of a given circle of substrates is 12, then two successive rotations of 10° suffice to effectuate the deposit of three layers of material through three masks.

During the phases of evaporation separated by the steps of mask change, the mask-substrate assemblies are uniformly rotated within the interior of the vacuum chamber, while the cups containing the materials to be deposited by evaporation on the substrates remain fixed. Thus it is possible to obtain a homogeneous distribution of the deposited layers.

Preferably the plate which supports the substrates comprises a certain number of holes in each of which is lodged a floating casing, the lower surface of which is fixed to the substrate. The casing comprises fixed abutment shoulders and adjustable abutments to center and position the substrates relative to the predetermined reference positions. When the substrates are rectangular, the fixed abutments bear against two adjacent sides of the rectangle, while the two adjustable abutments cooperate to maintain the substrate and to position it exactly by bearing against the two other sides of the rectangle. Moveover, the casings comprise recesses which cooperate with pins fixed on the mask support to position precisely the masks relative to the substrates.

Also, the upper part of the vacuum chamber is provided with heating means which may be in the form of infra-red radiation tubes known per se, so as to raise the temperature of the interior of the chamber to between 80° and 120 ° C. thereby to improve the adherence of the layers on the substrates.

The cups containing the materials to be deposited are secured in the lower part of the vacuum chamber. They have the form of hollowed plates comprising electric resistance heating means. Preferably they are formed of electrically resistive material and are mounted on supports which also serve as electric current conductors. Above each cup is a shield individually driven by an electric motor which serves to cover the cup during the deposition phases in which it is not used.

The drive axle to rotate the substrate-mask assembly and the axle of the mask-changing mechanism are coaxial. Their free ends support the plates which support the masks and substrates.

Still further, the mask-change mechanism comprises locking means provided to assure the successive deposit of the different layers in a predetermined order without the possibility of omitting a layer or of passing from the $i$ mask to the $i + 2$ mask while skipping the $i + 1$ mask. This apparatus comprises a ratchet wheel and a dog whose operation is controlled by a cam and a latch.

In order to effect the movement toward and away from each other of the substrate support and the mask support, the mask-change mechanism includes a nut displaceable along a threaded shaft. When the shaft is turned about its axis, the nut which is fixed to one of the plates undergoes a longitudinal displacement which moves the plates toward or away from each other.

Other objects, features and advantages of the present invention will become apparent from a consideration of the following description, taken in connection with the accompanying drawings, in which:

FIG. 3 is a top plan view showing a portion of the mask-changing mechanism of FIG. 2;

FIG. 4 is a bottom plan view of a casing carrying a substrate;

FIG. 5 is a cross-sectional view on the line A—A of FIG. 4 and showing the manner of placement of the casings on the plate carrying the substrate;

Figure 1:
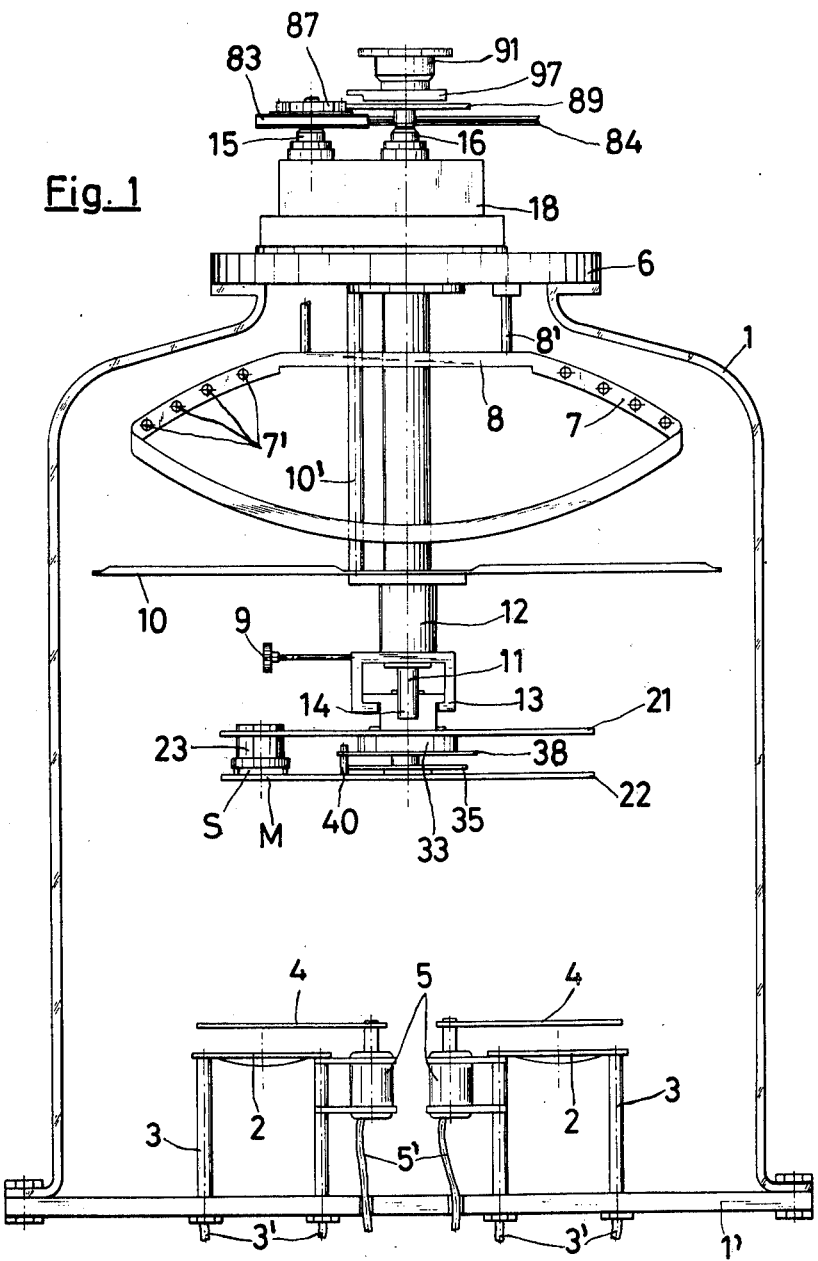
FIG. 1 is a somewhat schematic view, with parts broken away, of apparatus according to the present invention.

Referring now to the drawings in greater detail, and first to FIG. 1 thereof, there is shown apparatus according to the present invention comprising a vacuum chamber 1 of bell shape and containing, secured to a base plate 1', evaporative cups containing materials to be evaporated and deposited in successive layers on substrates which may for example be glass or ceramic plates. These cups comprise a hollow stamped plate 2 supported by columns 3 which serve also as connectors 3' for feeding heating current to electrical resistances which may be the plates 2 themselves. Each cup is provided with a superposed shield 4 operated by an electric motor 5 fed in an independent manner from conductors 5'.

Chamber 1 is closed at its upper end by a plate 6 which supports the plate 21 which is the substrate carrier, a plate 22 which carries the masks, the drive system for uniformly rotating the plates 21 and 22, the mask-changing mechanism, and a bundle of heating elements 7.

The bundle of heating elements 7 is comprised by a series of infra-red radiation tubes 7' secured to a frame 8 connected to the plate 6 by rods 8' which also conduct the current to the tubes 7', so that the temperature of the substrates can be raised to improve the adherence of the layers. A horizontal screen 10 carried by a support 10' separates the area in the chamber in which the heating elements are located, from the area where the evaporation and deposition of the material contained in the cups takes place, so as to avoid the deposition of those materials on the upper part of the chamber 1 and in particular on the heating elements 7.

The guide means for rotating the plates 21 and 22 comprises a central axle 11 and a coaxial surrounding axle 12 which may be rotated separately or simultaneously. Axle 12 has fixed thereto a bayonet connection 13 and axle 11 terminates downwardly in a pin 14 which is positioned relative to the bayonet connection 13 by means of a screw 9.

Plate 21 carries casings 23 whose centers lie on a circle which is concentric to the axes of axles 11 and 12 and whose lower faces carry substrates S to which are applied the masks M carried by the plate 22.

The mask changing mechanism which is located between the plates 21 and 22 and comprises a nut 33, a disc 38 integral with nut 33, a cam 35 and a pin 40 which is spring-urged into peripheral recesses 39 of disc 38, as will be described in greater detail with reference to FIGS. 2 to 4.

The guide mechanism for plates 21 and 22 and for the mask changer is located outside chamber 1. It is schematically shown in FIG. 1 but is described in greater detail with reference to the subsequent figures. It comprises a drive belt 84, pulley 83, drive pinions 87, 89, knob 91, bearings 15 and 16 and a sealed cap 18 permitting the passage of the drive and control means to the interior of the suction chamber.

Figure 2:
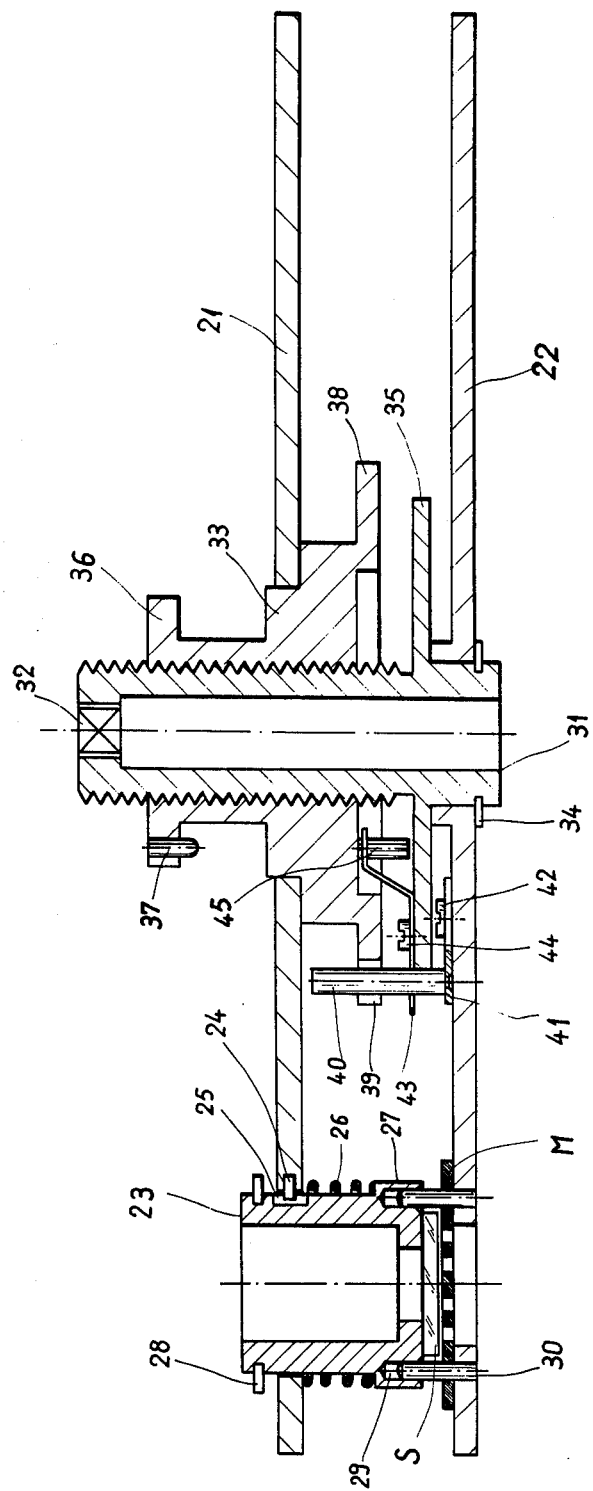
FIG. 2 is an enlarged cross-sectional view of the mask-changing mechanism of the apparatus of the present invention.

Referring now to FIG. 2, the circular plate 21 which carries the substrates S is disposed in a horizontal plane parallel to the circular plate 22 that carries the masks M. Plate 21 has a certain number of openings in which are disposed the casings 23 which carry on their lower faces the substrates S. They are maintained in place and suitably oriented thanks to positioning pins 24 cooperating with a vertical groove 25. A coil-compression spring 26 coaxial with casing 23 bears at one end on the underface of plate 21 and at the other end on flange 27 on the lower part of casing 23. A circlip 28 serves as a stop abutment limiting the vertical displacement of casing 23 downwardly, under the action of spring 26, when the plates 21 and 22 are remote from each other. The undersurface of casing 23 comprises recesses 29 whose interior diameter corresponds to the exterior diameter of pins 30 which are fixed to plate 22 and which cooperate with the recesses to position the masks with precision relative to the substrates.

A partially screw-threaded shaft 31 for connection to the pin 14 cooperates with nut 33 which supports the plate 21, to separate or bring together the two plates 21 and 22 according to the point which has been reached in the process for depositing the layers. A stop abutment 34, for example in the form of a circlip, retains plate 22 in position of shaft 31. The lower part of shaft 31 is provided with a horizontal cam 35 whose function will be described hereinafter. The upper part of nut 33 comprises wings 36 which engage with bayonet connection 13, the connection being completed by a pin 37.

The mask-changing mechanism also includes locking means to prevent, in a case where three successive layers are deposited on the same substrate, that the third mask will be brought into contact with the substrate directly after the first. To this end, the nut 33 has an enlarged zone constituting the disc 38, provided with peripheral recesses 39. There number depends on the number of successive masks which come into contact with the surface of the substrate. Pin 40 fixed to one end of lever 41 articulated on plate 22 to which it is fixed by means of a rivet 42, tends to enter the recesses 39 under the action of a spring 46 (not shown in FIG. 2) fixed at one end of the lever 41.

A second lever 43 pivotable in a horizontal plane about a rivet 44 fixed to the cam 35 cooperates with pin 45 fixed to the nut 33 to connect the locking means so as to prevent the pin 40 from passing from the first to the third recess 39 without regard to the second recess. The operation of this apparatus is described in detail in connection with FIG. 6.

FIG. 3 is a view from above illustrating a fragment of the plate 22, the change mechanism of the masks and a substrate S to which three masks M1, M2 and M3 correspond which are to be brought successively into contact with the lower surface of substrate S. Cam 35 fixed to threaded shaft 31 comprises a nose 47 and a ramp 48 that act on pin 40 to move pin 40 from one recess 39 to the next. When the cam 35 turns in the direction of the arrow, pin 40 fixed to the end of lever 41 articulated to the plate 22 by rivet 42, bears continuously on the profile of the cam under the action of spring 46. Accordingly, the lever occupies the position 41' illustrated in phantom line and the pin 40, which moves into position 40', leaves recess 39. If the cam continues to turn, the nose 47 engages the pin 40 to cause it to pass to the following recess 39 of the disc 38 fixed to the nut 33.

FIG. 4 shows another means for securing a rectangular substrate S to the cylindrical casing 23 having a rectangular central opening 50 shown in phantom lines, whose size is slightly smaller than that of the substrate S. Three fixed pins 51 serve as abutments on two adjacent sides of substrate S. The two other adjacent sides are maintained in place by movable abutments 52 in recesses 53 and may be fixed by eccentric screws 54.

Referring to FIG. 5, there is shown a transverse cross section on the line A—A of the substrate casing assembly of FIG. 4, the casing comprising two annular plates 55 and 56 which can slide relative to each other along pins, for example the pin 51 which passes through the casing from top to bottom. Also, plates 55 and 56 are separated by springs 57 whose purpose will be explained below. In the embodiment shown in FIGS. 4 and 5, the casing 23 is disposed in a circular recess of the plate 21 and there maintained by circlip 28. The positioning of the casing with respect to the plate 21 is effected by one or more pins, for example pin 51, which is received in the recess 59 of plate 21. When the plate 22 is brought against the plate 21 so as to deposit a layer on substrate S through mask M, the mask comes directly into contact with the lower surface of the substrate. The small differences of thickness of the substrates are accommodated by the springs 57.

Figure 6:
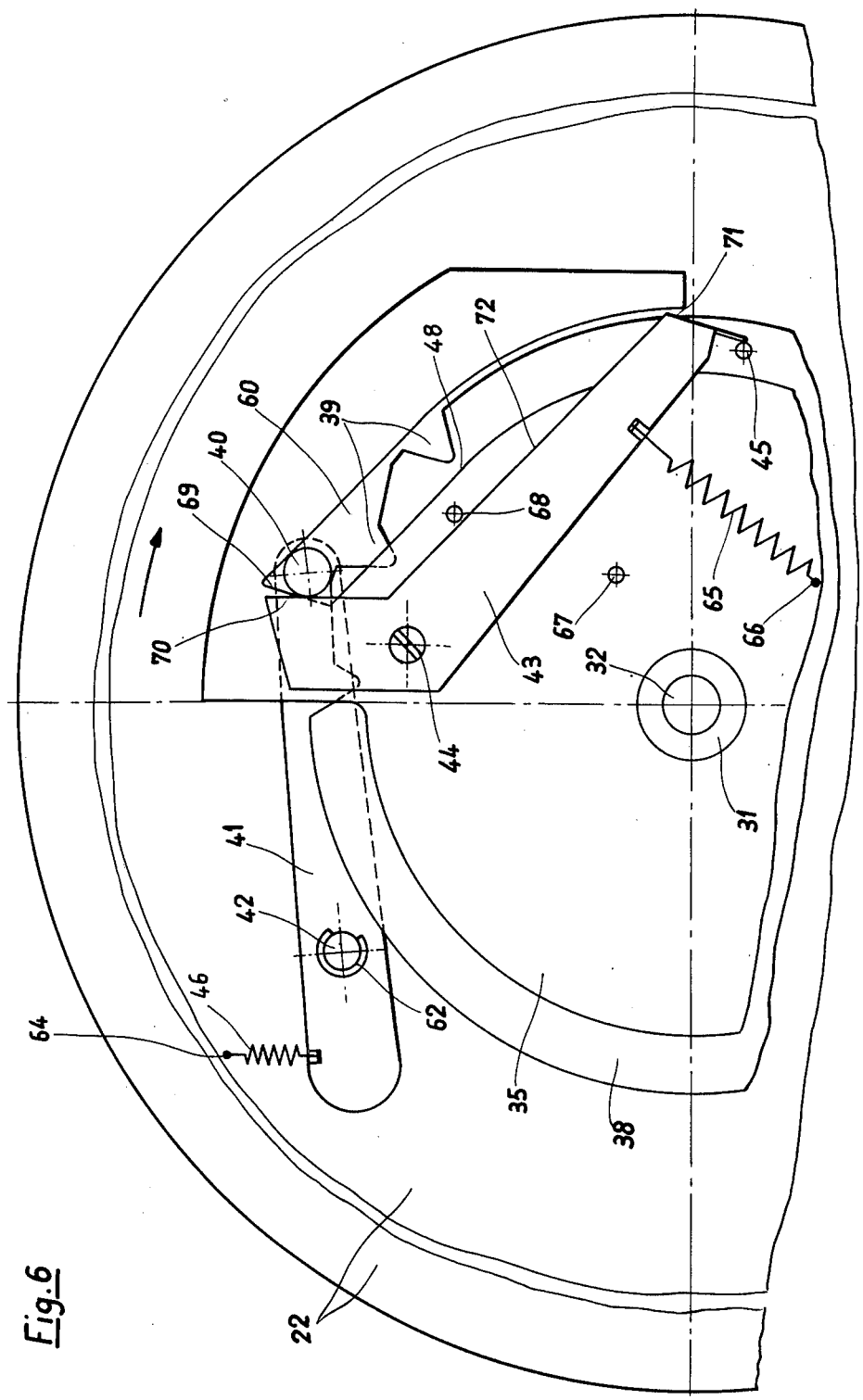
FIG. 6 is a fragmentary schematic top plan view of the locking mechanism of the mask-changer of FIG. 2.

FIG. 6 shows an embodiment of the locking means which were shown in part in FIG. 2. Cam 35 fixed to the threaded shaft 31 has a tangential groove 60 whose portion 48 is in the form of a ramp on which the pin 40 bears. This pin is fixed perpendicular to the end of lever 41 articulated about the rivet 42 and is maintained by circlip 62 on plate 22. The other end of lever 41 is urged by spring 46 one of whose ends is connected to the lever 41 and the other to the plate 22 by known means, for example by a pin 64. Lever 43 articulated on rivet 44 fixed to cam 35 is urged by spring 65 fixed between one end of the lever and a pin 66 on cam 35. Three abutments 45, 67 and 68 limit the movement of lever 43 during the different phases of operation of the device.

To change the mask, the central threaded shaft 31 is turned manually by means of knob 91 and thus the cam 35, which is fixed to it, about three quarters of a turn to bring it into the position shown in FIG. 6. In rest position, the lever 43 urged by the spring 65 bears against the abutment 67. When the cam turns, the ramp 48 moves progressively the pin 40 out of the recess in which it is lodged. Upon continuing the turning movement, the end 70 comes into contact against the pin 40 serving as an abutment, and then when this movement continues, the lever 43 swings about its pivotal axis 44, the point 71 coming near the outer abutment of the groove 60, and its side 72 coming to bear against the abutment 68. If the rotation of the cam continues, the radial abutment 69 comes into contact with the pin 40 which is driven and advances in the direction of the arrow and, under the urging of the spring 46, engages in the next recess 39. During this last phase of the rotation of the cam, the plate 22 is rotatively driven with respect to the enlarged portion 38 of the nut 33 and finally with respect to the plate 21. In this position, the lever 43 is blocked by the pin 45 and a complementary advance of the cam is not possible until after the return to rear position to free the lever. This operatin is useful between the passage from the first to the second mask when there is risk of passing directly from the first to the third while skipping the second. But if the number of layers to be deposited is increased, this same system may be used for any number of masks having an equal number of corresponding recesses 39.

Figure 7:
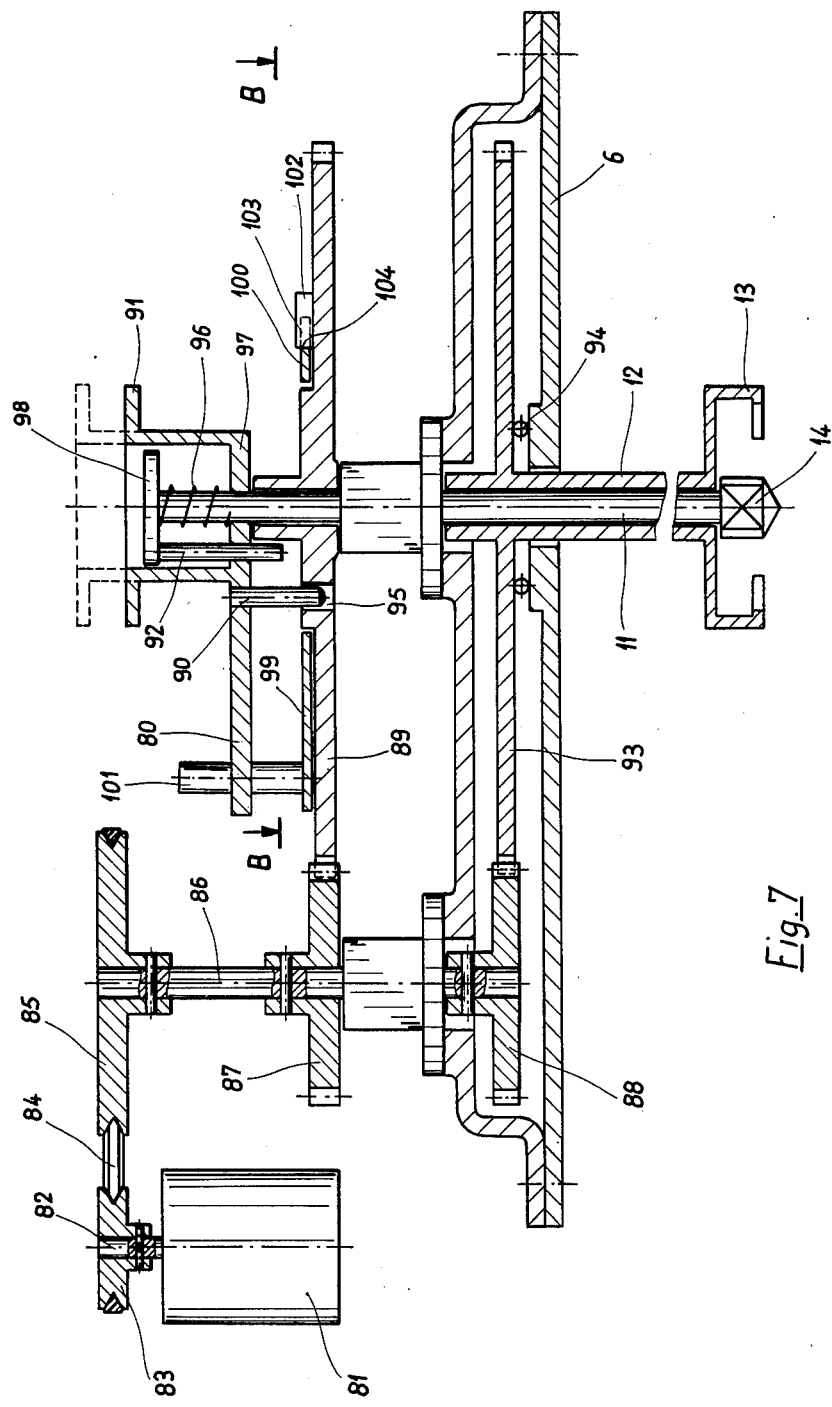
FIG. 7 is a cross-sectional view of the drive system of the mask changer of FIG. 2.

Referring now to FIG. 7, the drive means for the mask changer comprises a pin 14 for the recess 32 and the bayonet coupling 13 that engages with the wings 36. An electric motor 81 whose shaft 82 carries V-pulley 83 connected by belt 84 to pulley 85, provides for continuous rotative driving of the mask-substrate assembly. Pulley 85 is mounted on axle 86 which also drives identical pinions 87 and 88. Pinion 87 meshes with toothed wheel 89 which drives the axle 11 of pin 14 by means of a pin 90 fixed on the knob 91, this latter being itself secured to the axle 11 by means of pin 92. Pinion 88 meshes with a toothed wheel 93 fixed to the drive axle 12 of bayonet coupling 13 coaxial with the axle 11 of pin 14. Toothed wheel 93 rests on plate 6 which closes the vacuum chamber at its upper end, by means of a roller bearing schematically indicated by balls 94. In rest position or during those portions of the process in which the pin 14 and the bayonet coupling 13 are simultaneously driven, pin 90 is disposed in recess 95 of the toothed wheel 89. A spring 96 bears on the one hand on the lower plate 97 of the knob 91 and on the other hand on the disc 98 which caps the upper end of axle 11. A finger 99 fixed to the periphery of a rotating plate 100, carries at its free end an abutment 101 perpendicular to the plane of the plate 100. A ratchet 102, shown in greater detail in FIG. 8, comprises a nose 103 which engages in the peripheral recesses 104 of the plate 100.

Figure 8:
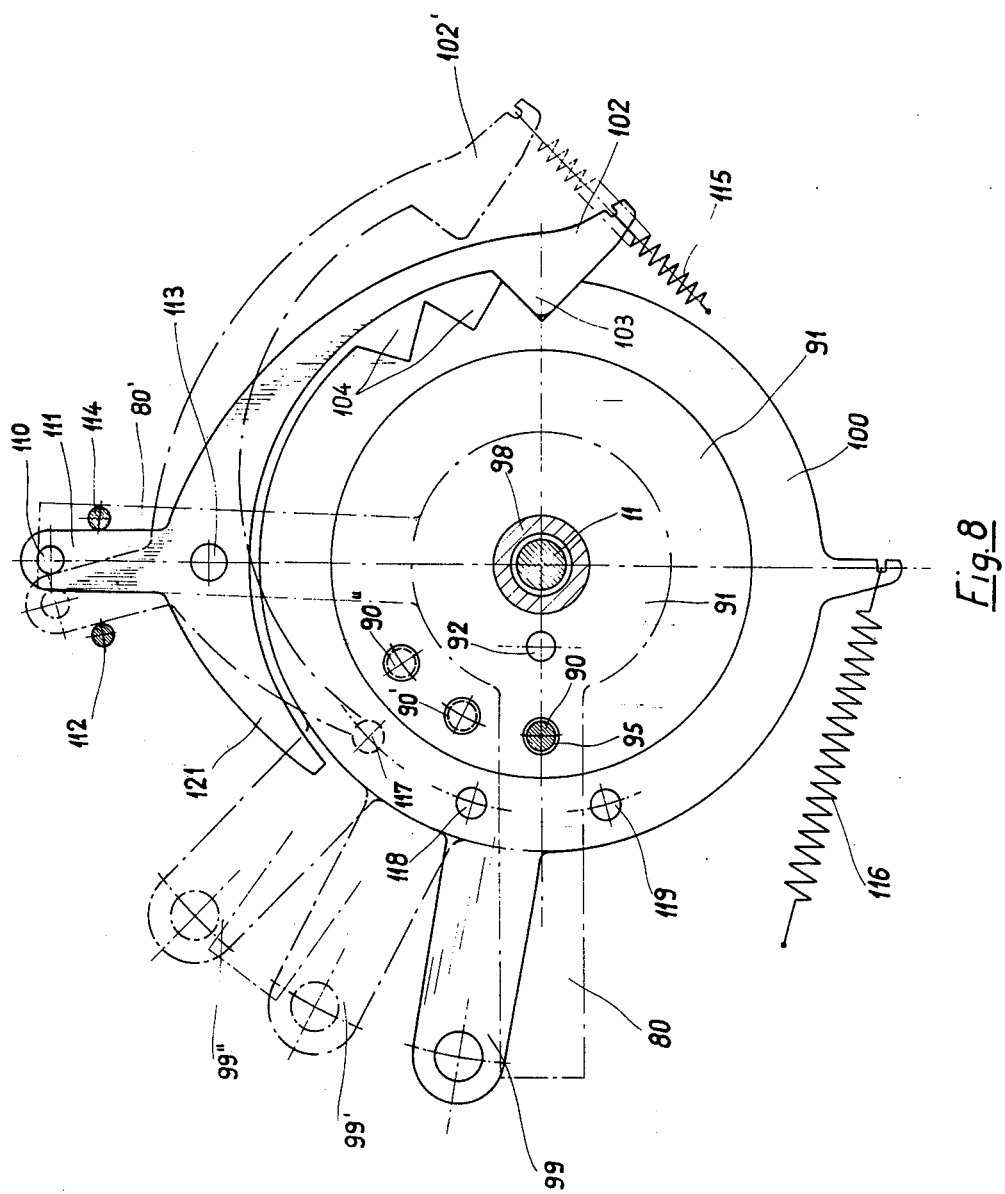
FIG. 8 is a cross-sectional view taken on the line B—B of FIG. 7.

In the position shown in FIGS. 7 and 8, the latter being a cross section of the drive means of FIG. 7, which permits in particular the angular displacement of the pin 14 with respect to the bayonet coupling 13, let it be assumed that the drive motor is at rest. When the knob 91 is raised, the pin 90 disengages from recess 95, freeing the axles 11 and 12 relative to each other. Knob 91 is prolonged by a nose 80 and thus turns about three quarters of a turn to come into contact against pin 110 carried by an elongation 111 of the pivotable ratchet 102. Nose 80 finally occupies the position 80' after having pressed the elongation 111 against an abutment 112 and swung the ratchet 102 about a pivotal axis 113 to bring it into position 102' shown in phantom lines. At rest, the ratchet 102 bears against the abutment 114 under the action of spring 115, the nose 103 being disposed in one of the recesses 104. In the position 102', the nose 103 is disengaged from the recess 104 of the plate 100 which is thus freed and thus turns clockwise, under the action of spring 116. Finger 99 of plate 100 occupies successively the positions 99' and 99". To avoid that upon each successive rotation of the nose 80 the plate 100 will turn through an angle greater than the angle at the center separating two recesses 104, plate 100 carries a series of pins 117, 118, 119 which successively come into abutment with the point 121 of the ratchet 102 when it occupies the position 102'.

The deposit of multiple layers by means of a device according to the present invention comprise the following operative steps:

The masks and the substrates are placed on their respective rotatable plates and the pin 14 is connected to the bayonet coupling 13 by means of the screw 9, The chamber 1 is evacuated by coupling thereto a vacuum pump (not shown), The temperature of the chamber is raised to about 100° C. by means of the heating elements 7, The substrate-mask assemblies are driven in uniform rotation by means of motor 81 connected by an assembly of pulleys, pinions, and the belt described above, to the drive axles 11 and 12 of the plates 22 and 21, The cup containing the first material to be deposited on the substrates is heated, the shield covering the corresponding cup being swung aside by operation of the corresponding motor 5, and the deposit of the first layer proceeds, Then, the changing of masks is effectuated by raising the knob 91 so as to disengage pin 90 from recess 95, turning knob 91 which is connected to the threaded shaft 31 about three quarters of a turn to move the plates 21 and 22 apart from each other and to advance the plate 22 relative to the plate 21, as described in connection with FIG. 8, and then returning the knob 91 to its initial position to move the plates 21 and 22 back together and finally to couple the axles 11 and 12 by means of pins 90 and 92. The apparatus is then ready for the second deposit.

The apparatus according to the invention thus assures with maximum certainty an even deposition of successive homogeneous layers of material by evaporation under vacuum on a large number of substrates by means of a variable number of masks of various forms.

From a consideration of the foregoing disclosure, therefore, it will be evident that all of the initially recited objects of the present invention have been achieved.

Although the present invention has been described in connection with preferred embodiments, it is to be understood that modifications and variations may be resorted to without departing from the spirit of the invention, as those skilled in this art will readily understand. Such modifications and variations are considered to be within the purview and scope of the present invention as defined by the appended claims.

What is claimed is:

1. Apparatus for depositing under vacuum successive plural layers on a plurality of substrates with the use of masks, comprising a vacuum chamber, and in said chamber at least one support carrying substrates, at least one support carrying masks, and means for the vacuum deposition of at least two layers of material contained in evaporative cups on the said substrates through the said masks, said substrate support comprising a horizontal rotating plate, said mask support comprising a rotating plate parallel to the first-mentioned plate, and the means for depositing layers comprising at least one cup containing materials to be disposed on the substrates, a mechanism for changing masks which permits moving the rotatable plates toward and away from each other and advancing one of them with respect to the other, an alignment system for masks relative to the substrates, and drive mechanism for uniformly rotating the assembly of masks and substrates, characterized in that a rotative drive axle of the substrate support and an axle of the mask support are coaxial and in that the mask and substrate supports are secured in the vacuum chamber to the ends of these axles.

2. Apparatus according to claim 1, characterized in that said axles are concentric, one of said axles being disposed within the other of said axles.

3. Apparatus for depositing under vacuum successive plural layers on a plurality of substrates with the use of masks, comprising a vacuum chamber, and in said chamber at least one support carrying substrates, at least one support carrying masks, and means for the vacuum deposition of at least two layers of material contained in evaporative cups on the said substrates through the said masks, said substrate support comprising a horizontal rotating plate, said mask support comprising a rotating plate parallel to the first-mentioned plate, and the means for depositing layers comprising at least one cup containing materials to be disposed on the substrates, a mechanism for changing masks which permits moving the rotatable plates toward and away from each other and advancing one of them with respect to the other, an alignment system for masks relative to the substrates, and drive mechanism for uniformly rotating the assembly of masks and substrates, characterized by mask-change mechanism comprising lock means to avoid that a layer $i + 2$ deposited through the corresponding $i + 2$ mask will not be disposed directly after layer i without layer $i + 1$ first being deposited, said mechanism comprising a toothed wheel and a ratchet whose action is controlled by a cam and a coupler.

4. Apparatus according to claim 3, characterized in that the ratchet is comprised by an enlarged portion of a nut of the mask-change mechanism having a number of peripheral recesses equal to the number of different masks to be brought into correspondence with the surface of the substrates, the ratchet also comprising an articulated lever carrying a fixed pin which is urged by a spring to a position such that the said pin will be introduced into one of the recesses.

5. Apparatus according to claim 4, and a second lever articulated on a control cam of the ratchet and cooperating with a pin fixed to the nut to prevent the pin of the ratchet lever from passing from a first recess to a third recess without entering the intermediate recess.

6. Apparatus for depositing under vacuum successive plural layers on a plurality of substrates with the use of masks, comprising a vacuum chamber, and in said chamber at least one support carrying substrates, at least one support carrying masks, and means for the vacuum deposition of at least two layers of material contained in evaporative cups on the said substrates through the said masks, said substrate support comprising a horizontal rotating plate, said masks support comprising a rotating plate parallel to the first-mentioned plate, and the means for depositing layers comprising at least one cup containing materials to be disposed on the substrates, a mechanism for changing masks which permits moving the rotatable plates toward and away from each other and advancing one of them with respect to the other, an alignment system for masks relative to the substrates, and drive mechanism for uniformly rotating the assembly of masks and substrates, characterized in that the mask mechanism comprises a screwthreaded shaft cooperating with a threaded nut which supports the first-mentioned rotating plate, so as to move together or apart with respect to each other the mask carrier plate and the substrate carrier plate upon relative rotation of said shaft and nut.

* * * * *